United States Patent [19]

Iwaskow et al.

[11] Patent Number: 4,983,456
[45] Date of Patent: Jan. 8, 1991

[54] COMPOSITIONS CONVERTIBLE TO REINFORCED CONDUCTIVE COMPONENTS AND ARTICLES INCORPORATING SAME

[75] Inventors: Richard S. Iwaskow, Pompton Lakes; Stephen M. Crum, Wharton, both of N.J.

[73] Assignee: American Cyanamid

[21] Appl. No.: 122,065

[22] Filed: Nov. 18, 1987

Related U.S. Application Data

[62] Division of Ser. No. 358,549, Mar. 16, 1982, Pat. No. 4,752,415.

[51] Int. Cl.$^5$ .................................................. C09J 7/02
[52] U.S. Cl. ..................................... 428/254; 428/260; 428/262; 428/288; 428/290; 428/367; 428/408
[58] Field of Search ............... 428/408, 367, 262, 260, 428/254, 288, 290

[56] References Cited

U.S. PATENT DOCUMENTS

4,169,911 10/1979 Yoshida et al. ..................... 428/367
4,471,015 9/1984 Ebneth et al. ....................... 252/511

Primary Examiner—Marion C. McCamish
Attorney, Agent, or Firm—Steven H. Flynn

[57] ABSTRACT

Electrically and/or thermally conductive reinforced compositions convertible to reinforced components are disclosed. The compositions comprise a polymeric material of little or no conductivity and high strength, metal plated composite fibers having a conductive semi-metallic core and a thin, firmly adhered layer of an electrodepositable metal coating on said core. The metal coated composite fibers will not lose their conductive coatings during normal processing and provide conductivity without reducing the physical properties of the polymeric material. The compositions of the invention are convertible to conductive components such as laminate prepregs, surface plys for laminates, conductive adhesives, conductive inks, and conductive elastomeric gaskets. The components can be incorporated in improved articles such as structural parts for transportation vehicles, printed circuit boards, lighting shields and molded articles.

10 Claims, 2 Drawing Sheets

COMPOSITIONS CONVERTIBLE TO REINFORCED CONDUCTIVE COMPONENTS AND ARTICLES INCORPORATING SAME

This is a divisional of application Ser. No. 358,549 filed Mar. 16, 1982, now U.S. Pat. No. 4,752,415.

BACKGROUND OF THE INVENTION

The present invention relates to compositions which are convertible to components useful in numerous applications. More particularly, the subject invention provides compositions comprising a polymeric material reinforced with electrically conductive composite fibers which are convertible to form conductive components.

Fibers of non-metals and semi-metals, such as carbon, boron, silicon carbide, titanium dioxide and the like, in the form of filaments, whiskers, mats and cloths are known to be useful in reinforcing organic polymeric materials. Articles comprising plastics reinforced with such fibers find wide-spread application in replacing heavier components made of lower strength conventional materials, such as aluminum, steel, titanium, vinyl polymers, nylons, polyesters, etc., in aircraft, automobiles, office equipment, sporting goods, and in many other fields. In many of these applications it has become increasingly desirable to provide electrically conductive, otherwise electrically functional and thermally conductive reinforced polymeric compositions which are convertible to form many useful articles or components for articles.

In the past, attempts at rendering polymeric materials electrically conductive have met with varying degrees of success. Loading polymers with carbon fibers has been tried, but in order to achieve acceptable electrical conductivity, so much carbon fiber must be added that there is a marked decrease in certain other desirable polymeric properties. Silver or other metal flakes and metal coated glass spheres have also been added to polymers yet, again, very high loading levels are needed to achieve electrical conductivity which becomes cost prohibitive for most applications and a decrease in polymer properties has likewise been observed. Another problem with the metal coated spheres is that the metal-sphere bond strength is not high enough to prevent peeling and flaking of the metal from the spheres, during normal polymer processing, such as high speed mixing, which results in decreased electrical conductivity in the final product.

Numerous unsuccessful attempts have been reported to provide fibers and filaments, and especially carbon filaments with an electrically conductive metal coating. In the past, thin metallic surface layers were deposited on the filaments by vacuum deposition, e.g. U.S. Pat. No. 4,132,828; electroless deposition; and electrolytic deposition, e.g. U.S. Pat. No. 3,622,283. Each of these methods failed to produce composite fibers having a satisfactory bond strength of metal coating to fiber so that when these fibers were bent and twisted as occurs during the processing of reinforcements and polymer materials, i.e., braiding, chopping, weaving, high shear mixing, paint roll mixing, extrusion, etc., the metal coatings would crimp, buckle, flake, and fall off the fiber core. Thus when these prior art fibers were incorporated into polymer compositions, they failed to provide a desirable level of continuous and uniform electrical conductivity. The prior art composite fibers were not satisfactory primarily because boundary layers present on the carbon filaments prevented satisfactory bonding of the metal to the filament. The poor adhesion of the metal is not only a processing problem, but seriously interferes with the ultimate end use, such as, for example, loss of conductivity of said articles when exposed to vibration and shock.

These boundary layers are formed during the preparation of high strength carbon fibers. The carbon fibers are made by heating polymeric fibers, e.g., acrylonitrile polymers or copolymers, in two stages, one to remove volatiles and carbonize and another to convert amorphous carbon into crystalline carbon. During such procedure, it is known that the carbon changes from amorphous to crystals, then orients into fibrils. If the fibers are stretched during the graphitization, then high fiber strengths are formed. This is implicit in the formation of the boundary layer, because as the crystals grow, there are formed high surface energies, as exemplified by incomplete bonds, edge-to-edge stresses, differences in morphology, and the like. It is also known that the new carbon fibrils in this form can scavenge oxygen from the air, and even organic materials, to produce non-carbon surface layers which are firmly and chemically bonded thereto. Some of the boundary layer impurities can be removed by solvent treating, but not always completely. In any case, the boundary layers generally interfere with the formation of bonds between the metal and the inmost fibril.

It has recently been disclosed in copending application, Ser. No. 358,637, now abandoned, filed concurrently herewith, that new and improved composite fibers comprised of carbon filaments having uniform, continuous adherent thin metal coatings thereon may be prepared by electroplating the fibers, if a very high order of external voltage is applied. The voltage must be high enough to provide energy sufficient to push the metal ions through the boundary layers to provide contact with the fibrils directly. The bond strength of the metal to the core is not substantially less than about ten percent of the tensile strength of the metal, so that these composite fibers may be bent with neither transverse cracking on the compression side of the bend, nor breaking and flaking on the tension side of the bend when the elastic limit of the metal is exceeded. These fibers can be woven into cloths, yarns, mats, and the like, and can be folded and knotted without the metal flaking off. They are described as being compatible reinforcement for plastics and metals.

It has now been discovered that the composite fibers described in said above-mentioned application, are capable of being incorporated into a polymeric material which may then be converted to components exhibiting satisfactory electrical conductivity and wide utility.

Electrical and thermal conductivity may be provided by relatively low concentrations of composite fibers and, therefore, interference with other desirable polymer properties is minimal or non-existent.

SUMMARY OF THE INVENTION

In accordance with the: subject invention, new and improved compositions convertible to reinforced, conductive components are provided. The compositions of the subject invention comprise:
 (i) a polymer material with little or no conductivity; and
 (ii) composite fibers, the majority of which have an electrically conductive core and at least one thin, uniform, firmly adherent electrically conductive layer of at least one electrodepositable metal on said core, alone or in combination with other fibers, the amount of component (ii) in said composition being at least effective to render a component made from said composition conductive.

Any substantially non-conductive polymer material (i) is contemplated by the subject invention. The composite fibers (ii) of the subject invention exhibit metal-to-core bond strengths not substantially less than about 10 percent of the tensile strength of the metal and can be prepared by high voltage electroplating technique. The composite fibers (ii) may be present in the form of woven, knitted, or nonwoven fabrics, sheets, or mats, or may be in comminuted form. In preferred embodiments the semi-metallic core of the composite fibers is carbon, boron, or silicon carbide, with carbon filaments being especially preferred. The electrodepositable metal layer may be nickel, silver, zinc, copper, lead, arsenic, cadmium, tin, cobalt, gold, indium, iridium, iron, palladium, platinum, tellurium, tungsten, and mixtures of any of the foregoing, and the like.

The subject compositions are convertible to components. The means of conversion will vary with the particular polymeric material selected, and can include molding and/or curing by heat, light, catalysts, accelerators, etc., depending on the polymeric material selected. Examples of the components of the subject invention include: electrically conductive laminates, conductive coatings, conductive adhesives, conductive inks, conductive gaskets, and conductive caulking and sealing compounds.

The subject invention also relates to new and improved articles incorporating these new and improved reinforced electrically conductive components of the subject invention as essential structural features. Examples of these new and improved articles include: parts for transportation vehicles such as aircraft, space vehicles, automotive vehicles, seagoing vessels, for sporting goods, office equipment, and electronic appliances; printed circuit boards, lightning rods and antennae.

Further objects and advantages of the subject invention will become apparent from the following detailed description, when taken in conjunction with the drawings, in which:

DETAILED DESCRIPTION OF THE INVENTION

The subject invention provides new and improved compositions which are convertible to components and to new and improved articles incorporating said components. The subject compositions comprise:
(i) a polymeric material of little or no conductivity; and
(ii) conductive composite fibers.

The polymeric materials for use in the compositions of the subject invention are numerous and generally any known polymeric material may find application. By way of illustration, some of the known polymeric materials useful in the subject invention include: polyesters, polyethers, polycarbonate, epoxies, phenolics, epoxy-novolacs, epoxy-polyurethanes, urea-type resins, phenol-formaldehyde resins, melamine resins, melamine thiourea resins, urea-aldehyde resins, alkyd resins, polysulfide resins, vinyl organic prepolymers, multifunctional vinyl ethers, cyclic ethers, cyclic esters, polycarbonate-co-esters, polycarbonate-co-silicones, polyetheresters, polyimides, polyamides, polyesterimides, polyamideimides, polyetherimides, and polyvinyl chlorides. The polymeric material may be present alone or in combination with copolymers, and compatible polymeric blends may also be used. In short, any conventional polymeric material may be selected and the particular polymer chosen is generally not critical to the invention. The polymeric material should, when combined with the composite fibers (ii), be convertible by heat or light, alone or in combination with catalysts, accelerators, cross-linking agents, etc., to form the components of the subject invention.

Figure 1:
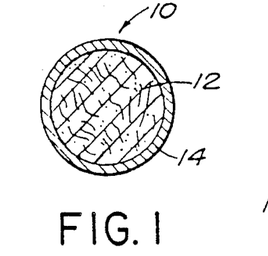
FIG. 1 is an elevated, magnified cross-sectional view of one electroplated graphite composite fiber for use with the subject invention.
Figure 2:
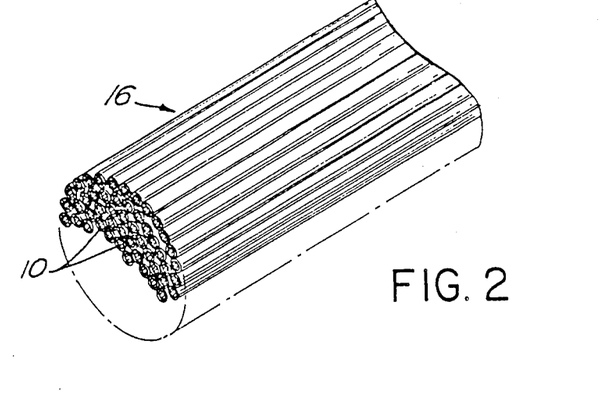
FIG. 2 is a perspective view of a bundle of the composite fibers for use with the subject invention.
Figures 3, 3A, 4:
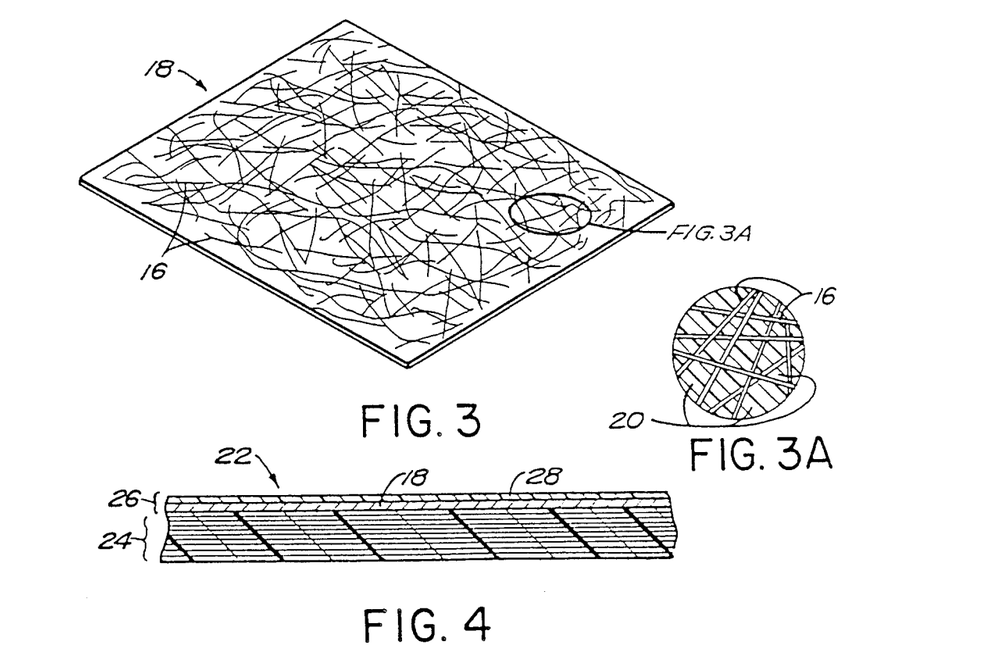
FIG. 3 is a perspective view of a nonwoven mat comprised of a plurality of the composite fibers for use in the subject invention.
FIG. 3a is a magnified detailed plan view of the nonwoven mat of FIG. 3 impregnated with a polymeric material for use in the subject invention.
FIG. 4 is an elevated, magnified cross-sectional view of one new and improved high performance component of the subject invention in the form of a laminate having an electrically conductive surface ply.

The electrically conductive composite fibers for use in the subject invention are shown in FIGS. 1-3. Referring to FIG. 1, a composite fiber 10 is shown. Composite fiber 10 comprises an electrically conductive semi-metallic core 12 and at least one thin, uniform, firmly adherent, electrically and/or thermally conductive layer 14 of at least one electrodepositable metal on said core. The semi-metallic core 12 may be made of carbon, boron, or silicon carbide, or other fibers although carbon fibrils or filaments are especially preferred. The fibers for use as the core material are commercially available from a number of sources. More particularly, suitable fibers are available from Hercules Company, HITCO, Great Lakes Carbon Company, AVCO Company and similar sources in the United States and overseas. Some of the carbon fibers are made, in general, by the procedures described in U.S. Pat. No. 3,677,705. Typically, the carbon fibers are made by heating a polymeric fiber, such as poly(acrylonitrile) fiber, in two stages, one to remove volatiles and carbonize and another to convert amorphous carbon into crystalline carbon, including graphite and other crystalline morphologies. During this procedure, the carbon changes from amorphous to crystal, then orients into fibrils. The fibers are stretched during the graphitization and a high strength fiber is formed.

The conductive electrodepositable metal layer 14 may be formed of any metal which may be deposited on a substrate by electrical means. In preferred embodiments the coating metals are nickel, silver, zinc, copper, lead, arsenic, cadmium, tin, cobalt, gold, indium, iridium, iron, palladium, platinum, tellurium, tungsten, or mixtures of any of the foregoing.

Composite fibers 10 are well-suited for incorporation with polymeric materials to provide electrically conductive components. The composite fibers 10 have a very high aspect ratio, i.e. length to diameter ratio, so that intimate contact between the fibers to provide conductive pathways through the polymer matrix is achieved at relatively low loading levels of fibers, and more particularly at much lower levels than the metal-coated spheres and metal flakes utilized in prior art attempts to provide electrically conductive polymer compositions. This ability to provide electrical, and/or thermal conductivity at low concentrations of fiber, significantly reduces any undesirable degradation or modification of the physical properties of the polymer.

The composite fibers 10 may be present in the subject compositions as single strands, or bundles of fibers or yarn 16 as shown in FIG. 2. The fibers 10 or bundles 16 may be woven into fabrics or sheets. In addition, the fibers 10, or bundles 16 may be comminuted and dispersed within the polymeric material, may be made into nonwoven mat 18 as depicted in FIG. 3, all in accordance with conventional techniques well-known to those skilled in this art.

The composite fibers for use in the subject invention are prepared by high voltage electroplating techniques, such as described in above-mentioned copending application Ser. No. 358,637, now abandoned, filed concurrently herewith. As described therein, the core fiber 12 in the form of a tow of fibers is immersed in an electrolytic bath and through suitable electrical connections, the required high external voltage can be applied. Although only 0.5 to 2.6 volts are needed to dissociate the electrolytic metal to ions, e.g. nickel, gold, silver, copper depending on the salt used, massive amounts of external voltage are needed, on the order of five times the dissociation values to push the metal ions through the boundary layer on the surface of the fibrils provide contact and bonding of the metal to the innermost fibril. Generally, preferred external voltages of 10 to 50 volts, or even more are used. The core fiber cathode is immersed in the plating bath until a uniform, continuous firmly adherent metal layer is deposited thereon. At the high voltage used in this technique care should be taken to cool the fibers as they enter and leave the plating bath to reduce the heat which develops in the fibers, such as by dousing with a cool liquid such as water.

The composite fibers 10 thus formed, exhibit metal to core bond strengths on the majority of the fibers of at least about 10 percent of the tensile strength of the metal deposit. Further the preferred composite fibers generally exhibit metal-to-core bond strengths in a range of at least 50 to 99% of the tensile strength of the metal deposit. The bond strength in each fiber is at least sufficient to provide that when the fiber is bent sharply enough to break the coating on the tension side of the bend because its elastic limit is exceeded, the coating on the compression side of the bend will remain bonded to the core and will not crack circumferentially. The fibers generally will not lose their metal coatings during ordinary or extraordinary polymer processing.

The compositions of the subject invention are convertible to many components. In one embodiment of the invention, a composition is prepared by immersing and wetting a nonwoven mat of the composite fibers, such as that shown in FIG. 3, into a polymeric resin solution, such as one formed by dissolving an epoxy resin or a phenolic resin in an alcohol solvent. Other forms such as undirectional fibers, woven fabrics and knitted fabrics can be used, too. This composition may then be converted to an electrically conductive component in the form of a resin impregnated prepreg useful for forming electrically conductive laminates. More particularly, the polymer resin solution-wetted mat may be heated to drive off the alcohol solvent. When the solvent removal is complete, a component is formed comprising a layer of randomly oriented and overlapping composite fibers or bundles of fibers having a polymeric resin layer, and in this case epoxy or phenolic resin layer, coating said fibers and filling any voids or interstices within the mat. A magnified detail of this is provided in FIG. 3a. Mat 18 is comprised of a multitude of chopped composite fiber bundles 16 cut to from about 0.125 to 3.5 inch lengths. Mat 18 has been immersed in a polymeric resin solution, and has been heated to drive off the solvent. The resulting resin-impregnated mat now contains polymeric material 20 filling the gross voids and some of the interstices between the chopped composite fiber bundle 16, to provide a substantially unitary structure. The resin impregnated prepreg so formed may be cut to standard dimensions, and several of the prepregs may be aligned one on top of the other, to form a conventional lay up. The lay up is then heated under pressure in a conventional laminating machine which causes the polymer resin to flow and then cure, thereby fusing the layers of the lay up together to form a hardened, unified laminate. The impregnating, drying, lay up, and bonding steps for preparing these laminates are conventional and well-known in the art. Further references as to materials, handling and processing may be had from the Encyclopedia of Polymer Science and Technology, Volume 8, pages 121-162, Interscience, New York, 1969.

The laminates prepared in accordance with the subject invention may be cut, molded, or otherwise shaped to form many useful articles. For example, the laminate could be made to form a structural base or housing for an electrical part or device, such as a motor, and because the housing is electrically conductive, effectively ground the device.

In an alternate embodiment, the composition of the subject invention comprises a thin, normally-non-conductive polymer film or sheet and a woven, nonwoven unidirectional sheet, etc., formed of the composite fiber as in mat 18 from FIG. 3. The polymeric film or sheet may be formed by conventional film forming methods such as by extruding the polymer into the nip formed between the heated rolls of a calender machine, or by dissolving the polymeric material in a suitable solvent, thereafter coating the polymer solution onto a release sheet, such as a release kraft paper with for example a "knife over roll" coater, and heating to remove the solvent. The polymer film or sheet is then heated to between 100° and 200° F. and laminated with the nonwoven mat of composite fibers by passing the two layers between the heated nip of a calender. The resulting component in the form of a fused polymer film supported with a conductive mat is useful, for example as a surface ply for laminates.

More particularly, and referring to FIG. 4, a new and improved electrically and/or thermally conductive laminate 22 is shown. Laminate 22 comprises a base laminate 24 and a surface ply 26. In the embodiment depicted therein, base laminate 24 is formed of a plurality of layers of resin impregnated fibers, woven cloths or mats. The prepregs have been fused to form a solid laminate part. Although the embodiment presently described includes a base laminate formed from the conventional prepreg materials, it should be understood that other laminate structures could comprise the base laminate 24 and the base need not be a laminate at all but rather could be a solid part comprised of some other material such as wood or plastic. Furthermore, it is also contemplated to provide constructions in which the conductive layer is within the consolidated laminate structure. Surface ply 26 comprises a polymeric film 28, adhesively adhered to a composite fiber mat 18. The surface ply 26 is adhered to base laminate 24 generally during the lay up and pressure-heating stages in the formation of the base laminate, although the surface ply may also be adhered at a later stage also by pressure heating. The finished laminate is provided with a uniform smooth surface which does not require any further finishing steps.

Figure 7:
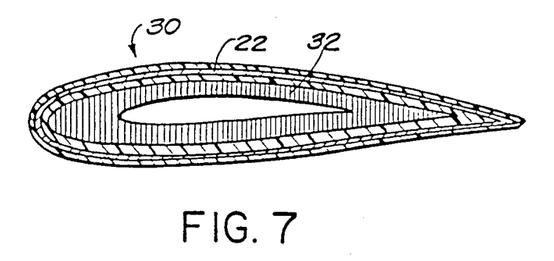
FIG. 7 is an elevated cross-sectional view of an airfoil incorporating the new and improved component laminate as shown in FIG. 4.

The composite surface ply 26 and the composite laminate 22 are very useful as parts for articles such as transportation vehicles. More particularly, a new and improved air foil 30 is depicted in FIG. 7 incorporating as an essential structural feature the laminate 22 of FIG. 4. Air foil 30 is in the form of a wing for an aircraft. Air foil 30 comprises a structural material core 32 having an adhered outer coating comprising the new and improved electrically conductive laminate 22 from FIG. 4. Primary structural core 32 can be a honeycomb structured high strength engineering material such as aluminum. Air foil structure 30 provides an effective lightning strike dissipation system for the aircraft. In the past, if lightning struck aircraft, the non-metallic parts would be subject to significant damage because of their non-conductive nature. With laminate 22 forming the outer surface of air foil 30, should lightning strike the craft, the resulting current will be conducted and dissipated through the conductive fiber mat and conductive base laminate, thereby reducing the risk and occurrence of damage to the airfoil.

The conductive surface ply/conductive laminate may be adhered to the structural core by any conventional means, such as by adhesives or by temperature pressure fusion.

In still another embodiment of the subject invention, the composition comprises a substantially non-conductive polymeric material having chopped or comminuted fibers 10 or fiber bundles 16 dispersed therein. The chopped or comminuted fibers may be dispersed in the polymeric material by any suitable means, such as by high speed mixing, Ross Vacuum Planetary mixing, extrusion or the like. The composite fibers are present in short lengths of up to about 3 inches in length and preferably in lengths of less than one inch, especially preferably less than one-fourth inch, in accordance with conventional practice. The fiber length and amount of composite fiber added which is sufficient to provide the desired level of electrical conductivity, will vary according to the particular end use for the composition.

This composition may be applied directly to the outer surface of structural parts for transportation vehicles such as aircraft, space vehicles, automotive vehicles, seagoing vessels and the like and then cured to form a hardened composite coating. The parts so treated can be plated and decorated more easily and thoroughly than parts which do not include such coatings because the electrical properties of the coatings permit them to be charged and electroplated, for example. This composition may also be applied to the surface of aircraft parts to provide effective lightning protection.

Figure 5:
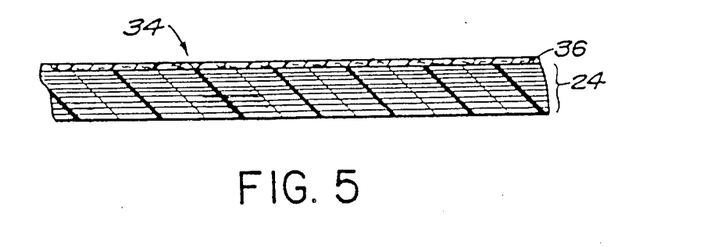
FIG. 5 is an elevated, magnified cross-sectional view of another high performance component of the subject invention in the form of laminate having an alternate embodiment of an electrically conductive surface ply.

An alternate embodiment of a conductive laminate 34 is shown in FIG. 5. Laminate 34 is similar to laminate 22 as described in accordance with FIG. 4 except that instead of surface ply comprised of a polymer film backed with a sheet of composite fibers, the polymer film 36 contains chopped or comminuted fibers dispersed throughout. This conductive polymer film may then be bonded to a base laminate 24 as described above.

Figure 6:
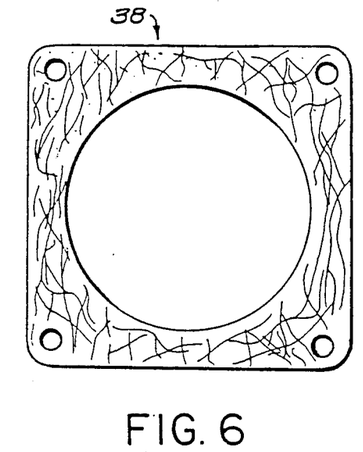
FIG. 6 is a plan view of another new and improved high performance component of the subject invention in the form of a planar sheet which has been cut to form an electrically conductive gasket.

The present compositions also include compositions comprising an elastomeric polymer material, such as a styrene-butadiene rubber composition, having chopped or comminuted composite fibers dispersed therein. These may be cast into thicker films or sheets, as well as other shapes by calendering or extrusion, respectively, and cured. The sheets may be punched or cut out to form conductive gaskets such as gasket 38 shown in FIG. 6. One particular advantage of these subject elastomeric compositions is that low concentrations of chopped fibers can effectively provide conductivity to the cured products. In the past, high levels of silver flakes or other particulate metals had to be dispersed within the elastomer to achieve electrical conductivity which lead to a decrease in the flexibility or elastomeric properties of the polymer. The gaskets prepared in accordance with the present invention are electrically and/or thermally conductive and exhibit good elastomeric physical properties as well.

Figure 8:
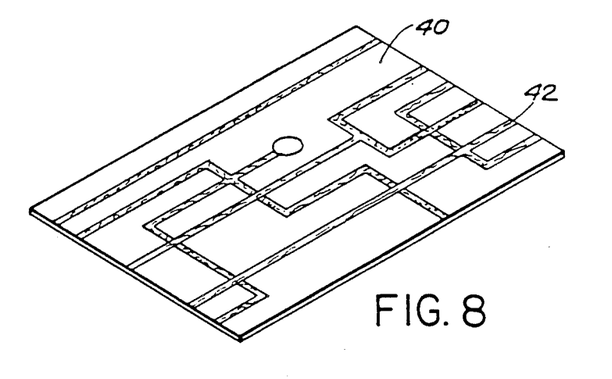
FIG. 8 is a perspective view of a new and improved printed circuit board incorporating another component of the subject invention in the form of a conductive ink.

The subject compositions also provide conductive ink compositions. The polymer material, such as a curable epoxy resin composition, including a solvent and dispersed chopped or comminuted composite fibers can be prepared to have suitable viscosities, such that the composition may be applied to a surface of a substrate by means of a brush, pen or roller, and then cured by heat or light to form a hardened conductive pathway along the surface of a substrate. The conductive ink compositions of the subject invention find particular application in the manufacture of printed circuit boards such as the one depicted in FIG. 8. The ink composition may be applied to a circuit board 40 substrate by means of a conventional silk screening technique. Generally an inked roller is passed over a template containing a positive image of the circuit to be printed. The roller is passed over the template and the conductive ink is transferred to the surface of the substrate 40, depositing a positive image of the circuit 42 thereon. The substrate 40 and ink 42 are then heated and ink 42 cures to leave an electrically conductive circuit on the circuit board 40. The conductive inks of the subject invention provide an easy two-step process for forming printed circuit boards, i.e. an applying step and a curing step. This is a distinctly advantageous method over current practices wherein in one method for example several steps such as plating the substrate with a copper foil, covering the copper with a photopolymerizable resist film layer, exposing the photoresist layer to cure-activating radiation through a template to selectively cure portions of the resist film corresponding to the circuit to be printed thereon, followed by dissolving and removing the uncured resist film layer and thereafter removing the unprotected and undesired copper film are required.

In still another embodiment of the invention, the subject composition is a molding composition wherein the polymeric material is for example, a polyester, polycarbonate, polystyrene, nylon, etc., resin molding composition having the chopped or comminuted fibers, or woven mats, in contact therewith. The fibers are dispersed in the resin by conventional means, and the composition is extruded to form pellets. The pellets may then be injection molded in accordance with customary procedures to produce shaped electrically conductive molded articles. The molded polyester resin articles exhibit good physical properties as well as conductivity.

Figure 9:
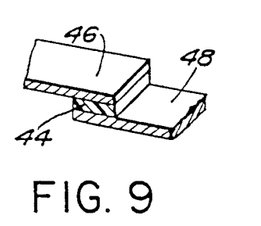
FIG. 9 is a perspective view, partially in section of a new and improved adhesive joint incorporating another component of the subject invention in the form of a conductive adhesive.

In still another embodiment, the subject invention comprises one and two part conductive adhesive compositions useful for joining or repairing conductors, as potting compounds for electrical equipment, and as caulking and sealing compounds. The one part adhesive compositions of the subject invention comprise an epoxy or polyester, or similar suitable resin, catalysts, accelerators and cross-linking agents as described and the chopped or comminuted composite fibers. The resin composition is prepared and the composite fibers are blended into the composition to wet the fibers, and a thixotropic paste is formed due to the surface effects of the fibers. The adhesive paste composition may be applied in between two electrical conductors and cured by heat to form an electrically conductive adhesive joint 44 shown in FIG. 9. Adhesive joint 44 is firmly bonded to electrical conductors 46 and 48 respectively, and exhibits good tensile strength and conductivity.

The two-part electrically conductive adhesive paste compositions comprise a part A including an epoxy or polyester resin and dispersed comminuted or chopped composite fibers and a part B including a curing agent, such as an polycarboxylic acid or acid anhydride, a polyamide or the like; a catalyst such as a tertiary amine; and comminuted composite fibers. In use part A and part B are thoroughly mixed to form an ambient temperature-curing thixotropic paste composition. It is preferable to have the composite fibers dispersed in both parts of the adhesive composition to ensure optimal and even dispersion of the fiber in the paste before the paste gels or sets. The composite fibers can be present in either part A or part B alone, and if that is the case, care should be taken to mix the composition thoroughly. The paste formed from the two part composition may be applied to two conductors 46 and 48 to from a conductive joint 44 therebetween as in FIG. 9. The two part composition may also find application as a potting composition for fixedly cementing and grounding an article of electrical equipment.

The compositions of the subject invention also provide an improved method for determining structural damage to structural parts, such as aircraft parts. In accordance with this aspect of the invention at least one composite fiber is imbedded in a planar sheet of structural material in the form of an elongated fiber or fiber bundle or as chopped or comminuted fibers. The composite fibers provide an electrical pathway through the polymeric structural sheet and end in at least two electrical terminals. This aspect of the invention also includes a polymeric structural sheet having a web or regular matrix of a plurality of the composite fibers and a plurality of electrical terminals. An external electrical testing device can be connected to any terminals to determine the electrical continuity of the structural sheet between the terminals. Any electrical discontinuities would indicate a break in the conductive pathway provided by the composite fibers which in turn would indicate structural damage to the particular part. Thus, the compositions of the subject invention permit mechanics to test for structural damage in structural parts by electrical analysis, which is a distinct advantage over the visual inspection methods practiced heretofore.

Figure 11:
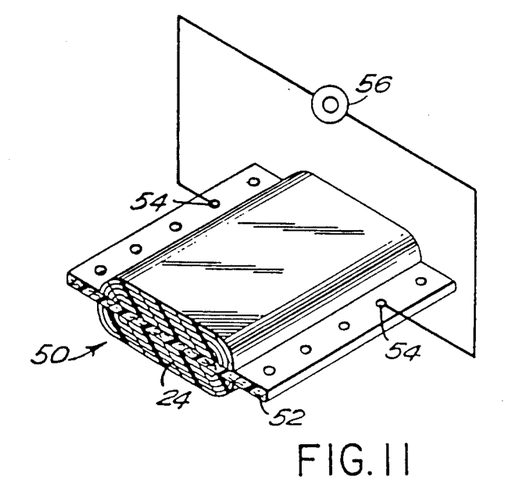
FIG. 11 is a perspective view partially in section of a laminated component embodying a conductive sheet having terminals and associated means for determining stress damage in accordance with the invention.

As an aid understanding this aspect of the invention, reference is made to FIG. 11 which shows a laminated structural sheet 50 in use to measure integrity of a part such as an aircraft empenage assembly. Sheet 50 includes a conductive inner ply 52 comprising a normally nonconductive resin 20, e.g., a catalyzed bisphenol A glycidyl ether resin, in contact with a woven, nonwoven, sheet or mat of metal coated fibers, and base outer laminate layers 24, top and bottom, of graphite fiber webs impregnated with the same epoxy polymer, for example. The outer edges of conductive sheet 52 include terminals 54 which are electrically connected to ohmmeter 56. If a void or break in sheet 50 occurs, this interferes with the electrically conductive pathway and reduces conductivity as measured by ohmmeter 56. Obviously, other variations of the basic concept will suggest themselves to those skilled in this art.

Figure 10:
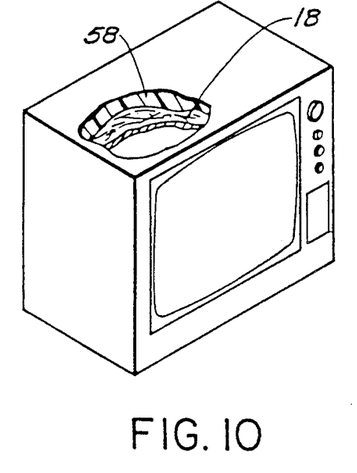
FIG. 10 is a perspective view of a television set having the top side thereof partially cut away to reveal another component of the subject invention in the form of a structural laminate for electrical appliances.

As can be appreciated, the subject compositions, are useful for forming numerous components and articles, and the foregoing disclosure and the following examples are not intended to be an exhaustive listing thereof. Rather they are intended to illustrate some of the preferred embodiments of the invention. For example normally non-conductive plastic 58 in television receivers and the like, can be provided with conductive sheets 18 when assembled as illustrated in FIG. 10.

EXAMPLE 1

This example illustrates the use of the composition of the subject invention to form an electrically conductive surface ply component for laminated articles.

A polymer film comprising a formulated adhesive epoxy resin (American Cyanamid Co. FM® 300) is prepared as follows:

A 1 kilogram sample of said resin is dissolved in a 50/50 v/v solvent solution of ethylene dichloride and methylethylketone at 78–80% solids in a 1 gallon capacity Ross Planetary Mixer equipped for vacuum. The above ingredients are mixed until solvation is complete. The resin solution is then degassed by stirring under a reduced pressure of 22 mm Hg for approximately 15 minutes.

The resin solution is then coated on a sheet of silicone treated kraft paper with a laboratory model "knife over roll" coater to a thickness of approximately 10 mils. The kraft paper backed epoxy film thus prepared is dried by gradual heating in an oven from room temperature to about 190° F. and thereafter heated at 190° F. for approximately 40 minutes.

A nonwoven mat weighing approximately 0.6 oz./yd. is prepared from chopped ¾ inch nickel plated graphite fibers (Celanese Corp. CELION ® 6000) prepared in accordance with disclosure in U.S. application Ser. No. 358,637, now abandoned, filed concurrently herewith.

The plated graphite fiber mat and the kraft paper backed epoxy resin film are laminated by simultaneously passing them through a heated nip roll, heated to 190° F., of a 2-roll laminating machine set at 10–12 mils nip separation thickness. A continuous unitary film product supported with the conductive fiber mat suitable for use as a surface ply will be produced.

A laminate incorporating the above surface ply can be prepared as follows:

A 12"×12" sheet of the surface ply material prepared above is placed against a 12"×12" pressing plate or tool which is previously prepared for release characteristics by treating with a polytetrafluoroethylene spray. The surface ply is smoothed to the tool with the edges in alignment and the kraft paper sheet is removed from the epoxy film layer of the surface ply. A conventional lay up of eight 12"×12" plies of a commercial 40% epoxy resin loaded graphite fiber prepreg (American Cyanamid CYCOM ® 985 GF 370 PW) is prepared directly on top of the fiber mat layer of the surface ply by placing each of the eight prepregs on top of each other with their edges in register. The laminate is then topped with polyamide resin impregnated glass cloth parting material and next a layer of fiber glass cloth as a "breather" is added. The laminate assembly thus formed is placed in a polyethylene bag equipped with a vacuum pump and care is taken to remove all excess air from the bag so that external air pressure exerted on the bag directly impinges upon the assembly. The bagged assembly and vacuum is placed in an autoclave and subjected to a heat/pressure cycle applying between 50 to 100 psi air pressure while heating at 5° F./minute until a temperature of 350° F. is reached. When the autoclave pressure reaches 20 psi, the vacuum is released to the assembly and the assembly is cured at 350° F. for 120 minutes at 20–50 psi and thereafter cooled to 150° F. The autoclave is vented and the assembly removed.

When the laminate has cooled to room temperature the conductive surface ply is tested for surface resistivity in accordance with ASTM D257-78. A test specimen having the dimensions of 50 mm×75 mm is cut from the 12"×12" laminate prepared above. Two 5 mm diameter holes are drilled in the specimen along the mid line, each disposed 25 mm from the opposed longitudinal ends and spaced 25 mm apart. Two taper pin electrodes are positioned in the drill holes of the sample and the sample is conditioned in an environmental chamber at 50% relative humidity and at 23°+2° C. for four days.

The electrodes are connected in series to a voltage source and a galvanometer. A voltage of 500 volts is applied to the circuit for 60 seconds and the current through the circuit on the galvanometer is noted. The resistance of the sample between the electrodes is calculated as R=V/I.

The surface resistivity, ρs, is calculated from the formula:

$$\rho s = \frac{P}{g} R_s$$

where

P is the perimeter of the specimen;
g is the distance between the electrodes; and
$R_s$ is the observed surface resistance in ohms.

The surface ply has a very low surface resistivity.

EXAMPLE 2

The following example illustrates the preparation of a comminuted composite fiber filled epoxy resin film as a conductive surface ply for laminates.

A solution of catalyzed formulated epoxy resin system (American Cyanamid FM ® 300) dissolved in a 50/50 v/v mixture of ethylene dichloride and methy ethyl ketone at 78–80% solids is prepared in a 1 gallon capacity Ross Planetary mixture as in Example 1. 30% by weight of silver plated graphite fiber prepared in accordance with the procedure disclosed in copending application Ser. No. 358,637, now abandoned and chopped into 1/64 inch lengths is added to the mixer and the composition mixed until the chopped fibers are uniformly dispersed throughout. The composition is degassed by stirring at a reduced pressure of 20 mm Hg for 15 minutes.

As in Example 1, the epoxy resin-chopped fiber composition is coated onto a sheet of silicone treated kraft paper with the "knife over roll" coater to a thickness of approximately 12 mils. The coated kraft paper sheet is dried in an oven by gradual heating to about 190° F. and the 190° F. temperature was maintained for approximately 40 minutes. A dry, filled polymer film according to this invention is produced.

The laminate is prepared with the polymer film prepared above as surface ply following the procedures of Example 1. The lay-up contains 12 layers of a commercial prepreg (see Example 1) which is bagged and cured in the autoclave.

The finished laminate has a uniform smooth surface suitable for final application without further finishing operations. When tested in accordance with ASTM 0257-78 as desired in Example 1, the surface ply has a very low surface resistivity.

EXAMPLE 3

The following illustrates the use of the composition of the subject invention as a one part conductive adhesive.

An adhesive composition was prepared as follows:

The following components were charged to a vessel equipped with a laboratory stirrer:

85 grams of bisphenol A glycidyl ether liquid epoxy resin (Dow Chemical, DER 331)

15 grams of bisphenol A glycidyl ether solid epoxy resin (Dow Chemical, DER 661)

4 grams of air milled dicyandiamide 4 grams of (2,4-tolylene) bis[dimenthylurea]

The contents of the vessel were thoroughly stirred and 50 grams of silver plated graphite fibers (see Example 2) chopped to 1/64 inch lengths were added and blended thoroughly to completely wet the fibers. A thixotropic paste was formed.

The volume resistivity of the paste adhesive was tested in conformance with ASTM D2739-72 in the following manner. A pair of brass plates were abraded with crocus cloth 452 and wiped clean with reagent grade methyl ethyl ketone. The plates were mounted vertically and spaced a distance of 20 mils apart. The adhesive paste prepared above was applied to the gap between the brass plates to form an adhesive joint and any excess adhesive paste was removed. The adhered brass plates were cured in an oven at 250° F. for one hour and the adhesive was allowed to cool to room temperature without supporting the plates.

A Kelvin (resistance) bridge was wired to the brass electrodes and the unknown resistance of the adhesive joint was noted. The volume resistivity was calculated from the following formula:

$$V = R_o A/L$$

where
V = volume resistivity ohm-cm
$R_o$ = observed resistance
A = cross sectional area of the test specimen in cm
L = thickness of adhesive layer in cm.

The volume resistivity of the adhesive joint was less than 0.03 ohm-cm. The joint also had a tensile strength of 1000 psi at room temperature.

EXAMPLE 4

This example illustrates how the subject invention can be carried out as a two part conductive adhesive system.

The following compositions are prepared:
Part A:
190 grams of liquid bisphenol A epichlorohydrin reaction product (Shell Chemical Epon 828)
33 grams of solid bisphenol A epichlorohydrin reaction product (Shell Chemical Epon 1004)
100 grams of silver plated graphite fiber, chopped to 1/80 inch lengths. The components are thoroughly mixed and packaged and reserved.
Part B:
170 grams of polyamideamine resin (General Mills Versamide 115)
10 grams of tertiary amine catalyst (Rohm & Haas DMP-30) and
90 grams of silver plated graphite fibers chopped to 1/80 inch lengths. Part B is thoroughly blended, packaged and reserved.

Part A and Part B are stirred until mixed forming a paste.

The paste is applied to a pair of brass plates to form a 10 mil adhesive joint and the joint is tested after curing for seven days at room temperature in accordance with the method of Example 3. The conductive adhesive has a very low volume resistivity.

EXAMPLE 5

The following illustrates the use of the composition of the subject invention as a conductive molding compound.

A polyester molding compound was prepared by charging the following reactants to a sigma mixer:
10.5 parts styrenated, thermosettable polyester resin (USS Chemical MR 13017)
12.3 parts styrenated thermosettable polyester resin (USS Chemical MR 13018)
0.6 parts calcium stearate
40.3 parts calcium carbonate
0.5 parts t-butyl perbenzoate
0.06 parts inhibitor (35% hydroquinone in dibutylphthalate)

After mixing for 15 minutes, 25.7 parts of nickel plated graphite fibers (Example 1) chopped to ¼ inch length are blended into the mix for 10 minutes. The resulting polyester premix is molded into 4" circular plaques in a molding press at 150° C. The plaques had a surface resistivity of 2 ohms per square when tested in accordance with Example 1.

Because of the excellent thermal conductivity of the above-described compositions and prepregs, they find utility in constructing tools for use in molding. Such tools, because of their unique characteristics, permit shorter cycle times as a result of their more rapid heat build up and cool down. In contrast, tools made with conventional materials require much longer cycle times.

The foregoing patents, application(s), and publications are incorporated herein by reference. Although the subject invention has been described in terms of preferred embodiments, it is apparent that modifications and changes may be made therein by those skilled in the art. For example, other fibers may be incorporated in the compositions of the invention such as cotton fibers, glass fibers, asbestos fibers and the like. Furthermore, instead of nickel and silver-coated graphite fibers conductive molding compositions can be made with other metal coated fibers, particularly gold coated fibers. In addition, the polymeric materials may contain any known additives such as flame retardants, mineral fillers and the like. All such modifications fall within the scope and spirit of the subject invention as defined by the appended claims.

What is claimed is:

1. A sheet-like structure comprising a substantially non-conductive polymeric material, and at least one conductive fiber in the plane of the sheet, said fiber said having an electrically conductive non-metallic or semi-metallic core and at least one thin, uniform, firmly adherent, electrically conductive layer of at least one electrodepositable metal thereon, the fiber further defining a continuous electrical pathway ending in at least two terminals.

2. A structure as defined in claim 1 wherein said polymeric material is a thermoset or a thermoplastic and said fiber comprises nickel coated, silver coated or gold coated graphite fiber.

3. A structure as defined in claim 1 wherein said polymeric material is selected from the group consisting of polyesters, polyethers, polycarbonates, epoxies, epoxy-novolacs, epoxy-polyurethanes, urea-type resins, phenolformaldehyde resins, thiourea resins, melamine resins, urea-aldehyde resins, alkyd resins, polysulfide resins, vinyl organic prepolymers multifunctional vinyl ethers, cyclic ethers, cyclic esters, polycarbonate-co-esters, polycarbonate-co-silicones, polyetheresters, polyimides, polyamides, polyesterimides, polyamideimides, polyetherimides and polyvinylchlorides.

4. A structure as defined in claim 1 wherein the semi-metallic core of said fiber is selected from the group consisting of carbon, boron and silicon carbide.

5. A structure as defined in claim 1 wherein said electrically conductive metal layer is formed of an electrodepositable metal selected from the group consisting of nickel, silver, zinc, copper, lead, arsenic, cadmium, tin, cobalt, gold, indium, iridium, iron, palladium, platinum, tellurium, tungsten, and mixtures of any of the foregoing.

6. A structure as defined in claim 1 wherein the bond strength of the electrodepositable metal layer to the core of said fiber is at least sufficient to provide that when the composite fiber is sharply bent, the coating on the tension side of the bend will break when its elastic limit is exceeded and on the compression side of the bend will remain bonded to the core and will not crack circumferentially.

7. A structure as defined in claim 1 wherein said polymeric material is present with a woven, knitted, or nonwoven fabric, sheet or mat comprising said fiber.

8. A structure as defined in claim 1 wherein said polymeric material is a polyester.

9. A composite comprising a plurality of sheets at least one of which is a structure as defined in claim 1.

10. A shaped article of manufacture formed from a structure as defined in claim 1.

* * * * *